(12) United States Patent
Futrell et al.

(10) Patent No.: US 6,447,961 B2
(45) Date of Patent: *Sep. 10, 2002

(54) OPTICAL PROXIMITY CORRECTION METHODS, AND METHODS FORMING RADIATION-PATTERNING TOOLS

(75) Inventors: John R C Futrell; William A. Stanton, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/858,834

(22) Filed: May 15, 2001

Related U.S. Application Data

(63) Continuation of application No. 09/429,737, filed on Oct. 27, 1999, now Pat. No. 6,245,468.

(51) Int. Cl.[7] .............................. G03F 9/00; G03C 5/00
(52) U.S. Cl. ............................................. 430/5; 430/30
(58) Field of Search .............................. 430/5, 30, 296; 395/500.2, 200.22

(56) References Cited

U.S. PATENT DOCUMENTS 5,879,844 A    3/1999   Yamamoto et al. ............ 430/30

Primary Examiner—S. Rosasco
(74) Attorney, Agent, or Firm—Wells St. John P.S.

(57) ABSTRACT

The invention encompasses an optical proximity correction method. A substrate is provided which is to be formed into a radiation-patterning tool. A first dataset is provided to define a first radiation masking pattern for a first part of the tool, and a second dataset is provided to define a second radiation masking pattern for a second part of the tool. OPC calculations are performed on the second dataset, and the second dataset is modified based on the calculations. The OPC calculations of the second dataset utilize at least a portion of the first dataset, but do not modify said portion of the first dataset. A pattern supported by the radiation-patterning tool substrate is formed utilizing the modified second dataset. The invention also encompasses a method of forming a radiation patterning tool. At least one DRAM array area of a semiconductive material substrate is defined, and at least one peripheral circuitry area is defined proximate the at least one DRAM array area. A DRAM dataset is provided to define a radiation masking pattern for at least some circuitry in the DRAM array area, and a peripheral circuitry dataset is provided to define a radiation masking pattern for at least some circuitry in the peripheral circuitry area. OPC calculations are performed on the peripheral circuitry dataset, and the peripheral circuitry dataset is modified based on the calculations. The OPC calculations of the peripheral circuitry dataset utilize at least a portion of the DRAM dataset.

14 Claims, 3 Drawing Sheets

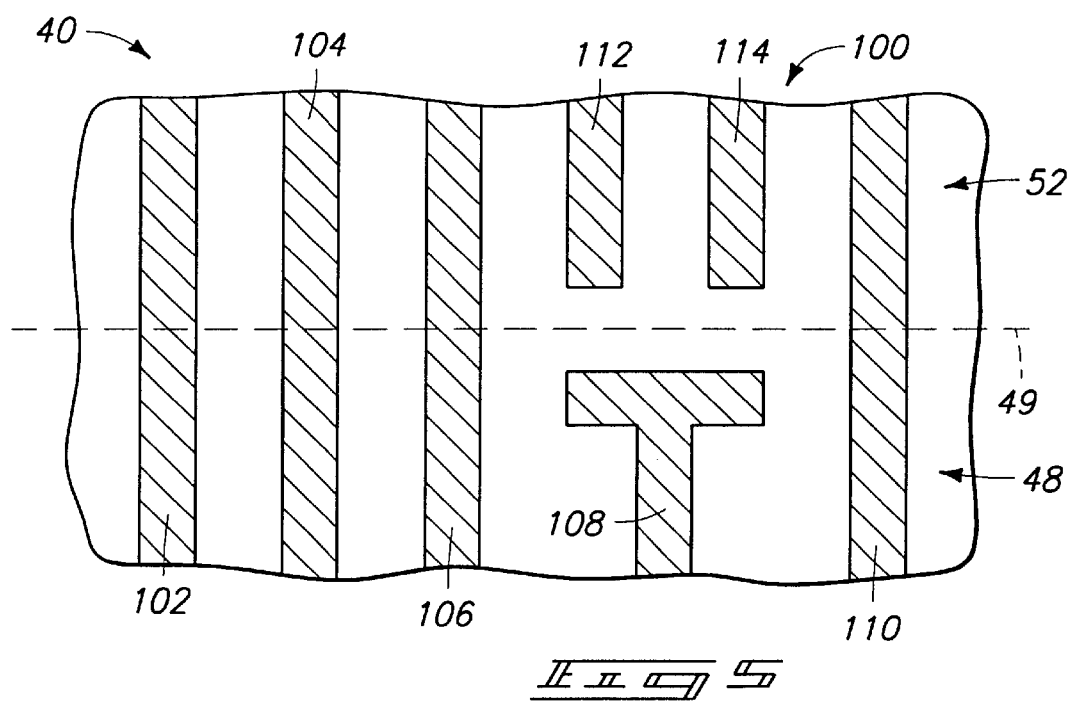
_Fig 5_
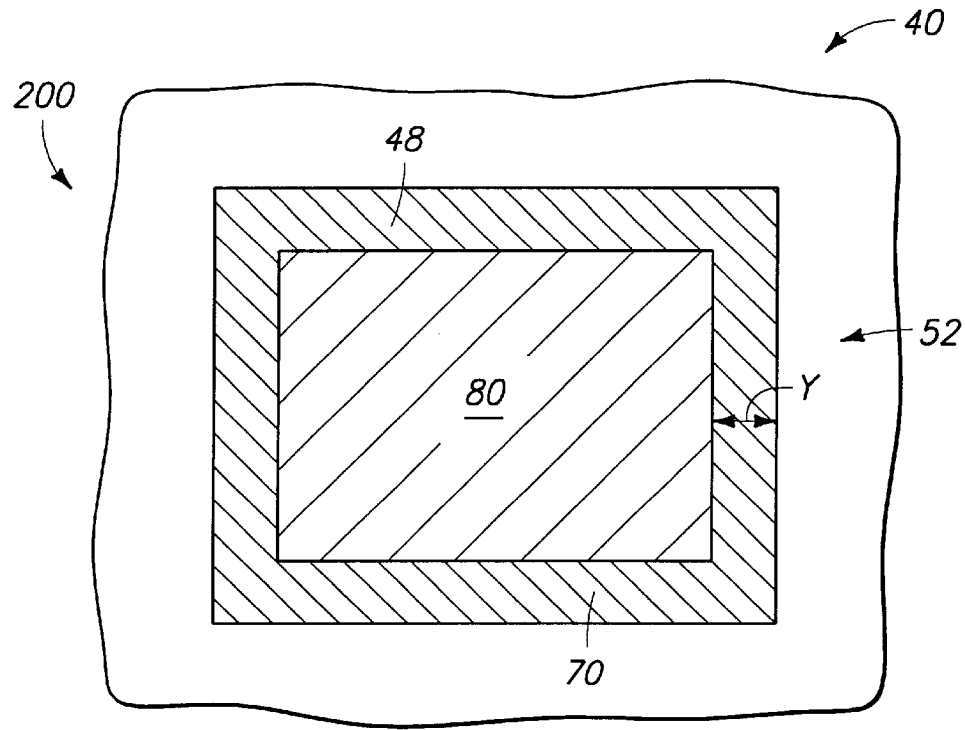
_Fig 6_

OPTICAL PROXIMITY CORRECTION METHODS, AND METHODS FORMING RADIATION-PATTERNING TOOLS

RELATED PATENT DATA

This patent resulted from a continuation application of U.S. patent application Ser. No. 09/429,737, filed Oct. 27, 1999, now U.S. Pat. No. 6,245,468.

TECHNICAL FIELD

The invention pertains to optical proximity correction methods, as well as to methods of forming radiation-patterning tools.

BACKGROUND OF THE INVENTION

Photolithography is commonly used during formation of integrated circuits on semiconductor wafers. More specifically, a form of radiant energy (such as, for example, ultraviolet light) is passed through a radiation-patterning tool and onto a semiconductor wafer. The radiation-patterning tool can be, for example, a photomask or a reticle, with the term "photomask" being sometimes understood to refer to masks which define a pattern for an entirety of a wafer, and the term "reticle" being sometimes understood to refer to a patterning tool which defines a pattern for only a portion of a wafer. However, the terms "photomask" (or more generally "mask") and "reticle" are frequently used interchangeably in modern parlance, so that either term can refer to a radiation-patterning tool that encompasses either a portion or an entirety of a wafer. For purposes of interpreting this disclosure and the claims that follow, the terms "photomask" and "reticle" will be given their historical distinction such that the term "photomask" will refer to a patterning tool that defines a pattern for an entirety of a wafer, and the term "reticle" will refer to a patterning tool that defines a pattern for only a portion of a wafer.

Radiation-patterning tools contain light-restrictive regions (for example, totally opaque or attenuated/half-toned regions) and light-transmissive regions (for example, totally transparent regions) formed in a desired pattern. A grating pattern, for example, can be used to define parallel-spaced conductive lines on a semiconductor wafer. The wafer is provided with a layer of photosensitive resist material commonly referred to as photoresist. Radiation passes through the radiation-patterning tool onto the layer of photoresist and transfers the mask pattern to the photoresist. The photoresist is then developed to remove either the exposed portions of photoresist for a positive photoresist or the unexposed portions of the photoresist for a negative photoresist. The remaining patterned photoresist can then be used as a mask on the wafer during a subsequent semiconductor fabrication step, such as, for example, ion implantation or etching relative to materials on the wafer proximate the photoresist.

A method of forming a radiation-patterning tool is to provide a layer of light-restrictive material (such as, for example, chrome) over a light-transmissive substrate (such as, for example, a fused silicon such as quartz), and subsequently etch a pattern into the light-restrictive material. The pattern can be etched by, for example, providing a masking material over the light-restrictive material, forming a pattern in the masking layer with an electron beam or a laser beam, and transferring the pattern to the underlying light-restrictive material with an etchant that removes exposed portions of the light-restrictive material. The patterned light-restrictive material can be considered to be "supported by" the tool, as well as to be "on" or "in" the tool.

In a typical process of fabricating semiconductor circuitry, a desired circuit pattern will be designed, and subsequently a radiation-patterning tool will be formed to create the pattern. A problem in forming the radiation-patterning tool is in correlating particular pattern shapes desired in the integrated circuitry to pattern shapes utilized in the tool. Specifically, a pattern shape formed in a tool will typically not be identical to a pattern shape generated with the tool because of interference patterns formed from light passing through the tool. The problem is described in FIGS. 1–3.

FIG. 1 illustrates a portion of a semiconductor wafer 10 comprising a material 12 thereover. Material 12 can comprise, for example, photoresist, and has a desired pattern 14 defined therein. Ultimately, pattern 14 is to be formed by passing light through a radiation-patterning tool to selectively expose the region encompassed by pattern 14 while not exposing other regions of material 12. Accordingly, a radiation-patterning tool is to be constructed which patterns light in the shape of pattern 14. FIGS. 2 and 3 describe alternative approaches for designing such radiation-patterning tool.

Referring to FIG. 2, such illustrates a result obtained from utilizing a radiation-patterning tool having a pattern identical to the shape of pattern 14 formed therein. Specifically, FIG. 2 shows a portion of a radiation patterning tool 16 having a light-restrictive material 18 formed over a substrate (not shown), and a pattern 20 formed within material 18. Pattern 20 constitutes a region wherein light-restrictive material 18 has been removed. FIG. 2 also shows a pattern resulting from passing light through patterning tools 16. Specifically, FIG. 2 shows semiconductive substrate 10 having material 12 thereover, and a pattern 22 corresponding to a region of material 12 exposed to light passing through pattern 20 of tool 16. A dashed line 14 over fragment 10 of FIG. 2 corresponds to the desired pattern shape 14 of FIG. 1. It is noted that pattern 22 is a poor approximation of the desired shape 14, and specifically that the corners of shape 14 are not present, and instead replaced by rounded features in the shape of pattern 22. In referring to FIG. 2, it is to be understood that the shape of pattern 22 is a qualitative approximation to a pattern expected from the shape 20 of tool 16, and is provided for diagrammatic purposes only. The illustrated shape of pattern 22 is not a quantitative representation.

FIG. 3 describes a prior art method which has been developed to compensate for the problem described with reference to FIG. 2. Specifically, FIG. 3 illustrates a radiation-patterning tool 26 having light-restrictive material 18 formed over substrate (not shown) and a pattern 28 formed therein. Pattern 28 has been developed utilizing optical proximity correction (OPC) software, such as, for example, a Taurus-OPC™ module (available from Avant! Corporation of Portland, Oreg.). Specifically, the desired pattern 14 (FIG. 1) is digitally mapped and provided to the software program, together with the wavelength of light which is to be passed through a radiation-patterning tool to form the pattern 14. The software then determines a pattern 28 which should be formed in the radiation-patterning tool to pattern the light in a shape which closely approximates the desired shape 14. FIG. 3 illustrates a portion of a semiconductive wafer having material 12 formed thereon and a pattern 30 formed by passing radiation through tool 26. FIG. 3 also shows a dashed line on fragment 10 corresponding to the desired shape 14. It is noted that pattern 30 more closely approximates desired shape 14 than did pattern 22 of FIG. 2. In referring to FIG. 3, it is to be understood that the patterns 28 and 30 are a qualitative approximations to actual patterns. The illustrated patterns 28 and 30 are not a quantitative representations.

A difficulty in utilizing OPC software can be in reducing the calculation time required for determining corrections for patterning tools having substantial size or complexity. For instance, in dynamic random access memory (DRAM) fabrication, there can be literally millions of circuit elements which are to be patterned with a single radiation-patterning tool. Mapping these elements into OPC software, and subsequently processing the elements to determine appropriate optical proximity corrections can take days. Accordingly, shortcuts have been developed for utilizing OPC in fabrication of DRAM circuitry. For instance, it is recognized that DRAM circuitry frequently comprises highly repetitive regions corresponding to DRAM arrays, and relatively non-repetitive regions corresponding to peripheral circuitry around the arrays. Accordingly, OPC of DRAM arrays is typically done in two distinct steps. One of the steps is to digitize the peripheral circuitry and perform OPC with appropriate software, while ignoring the repetitive regions of the DRAM array. The other of the steps is to first map a single repeated unit of the memory array and perform OPC on such unit. Next, the corrected unit is manually reproduced (stepped) across an entire expanse of a DRAM array to effectively perform OPC on the entirety of the DRAM array while ignoring the peripheral regions. The corrections for the memory array and the peripheral regions are combined to form a pattern which is to be provided on a radiation-patterning tool for creating DRAM circuitry.

It would be desirable to develop improved methods for performing OPC, and particularly to develop improved methods for performing OPC relative to patterns which are to be utilized in forming memory array regions and peripheral regions of DRAM circuitry.

SUMMARY OF THE INVENTION

In one aspect, the invention pertains to an optical proximity correction method. A substrate is provided which is to be formed into a radiation-patterning tool. A first dataset is provided to define a first radiation masking pattern for a first part of the tool, and a second dataset is provided to define a second radiation masking pattern for a second part of the tool. OPC calculations are performed on the second dataset, and the second dataset is modified based on the calculations. The OPC calculations of the second dataset utilize at least a portion of the first dataset, but do not modify said portion of the first dataset. A pattern supported by the radiation-patterning tool substrate is formed utilizing the modified second dataset.

In another aspect, the invention encompasses a method of forming a radiation patterning tool. At least one DRAM array area of a semiconductive material substrate is defined, and at least one peripheral circuitry area is defined proximate the at least one DRAM array area. A DRAM dataset is provided to define a radiation masking pattern for at least some circuitry in the DRAM array area, and a peripheral circuitry dataset is provided to define a radiation masking pattern for at least some circuitry in the peripheral circuitry area. OPC calculations are performed on the peripheral circuitry dataset, and the peripheral circuitry dataset is modified based on the calculations. The OPC calculations of the peripheral circuitry dataset utilize at least a portion of the DRAM dataset.

BRIEF DESCRIPTION OF THE DRAWINGS

Preferred embodiments of the invention are described below with reference to the following accompanying drawings.

FIG. 2 shows a diagrammatic, fragmentary, top view of a radiation-patterning tool having a pattern formed therein, and a diagrammatic, fragmentary, top view of a semiconductor substrate patterned with the tool.

FIG. 3 shows a diagrammatic, fragmentary, top view of a radiation-patterning tool having a pattern formed therein, and a diagrammatic, fragmentary, top view of a semiconductor substrate patterned with the tool.

FIG. 5 is a zoomed-in view of a region shown in FIG. 4.

FIG. 6 is a zoomed-in view of another region shown in FIG. 4.

DETAILED DESCRIPTION OF THE PREFERRED EMBODIMENTS

This disclosure of the invention is submitted in furtherance of the constitutional purposes of the U.S. Pat. Laws "to promote the progress of science and useful arts" (Article 1, Section 8).

In one aspect, the invention encompasses OPC methods pertaining to DRAM circuit patterns, and more specifically to a recognition that optical proximity corrections pertaining to peripheral circuit elements can be improved if data pertaining to memory array elements is included in the optical proximity corrections. The invention further encompasses a recognition that the data pertaining to DRAM array regions which is utilized in optical proximity corrections of peripheral circuitry regions is preferably not modified by the OPC calculations, as such modification will cost significant time and accomplish little gain relative to the quality of the pattern formed in a radiation-patterning tool. In another aspect, the invention encompasses a general recognition that it can be advantageous to digitally define portions of radiation masking patterns from one portion of a radiation-patterning tool which are not to be modified by OPC calculations, and to incorporate such digitally defined patterns into OPC calculations pertaining to other regions of a radiation-patterning tool.

Figure 1:
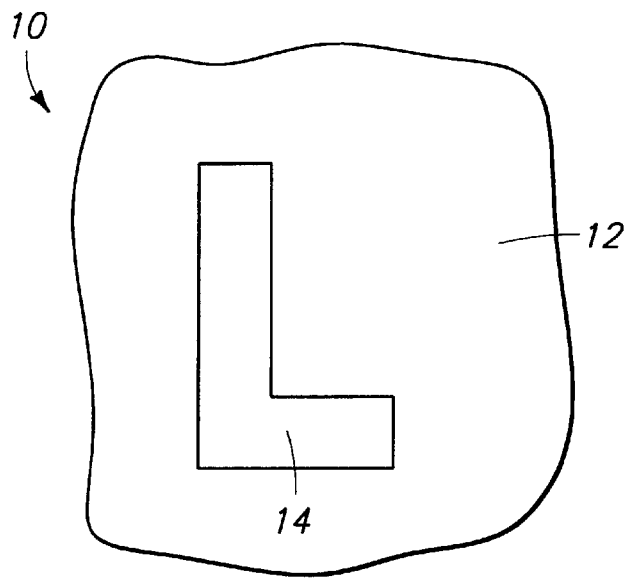
FIG. 1 is a diagrammatic, fragmentary, top view of a semiconductor wafer fragment comprising a desired pattern defined over a portion of the fragment.
Figure 2:
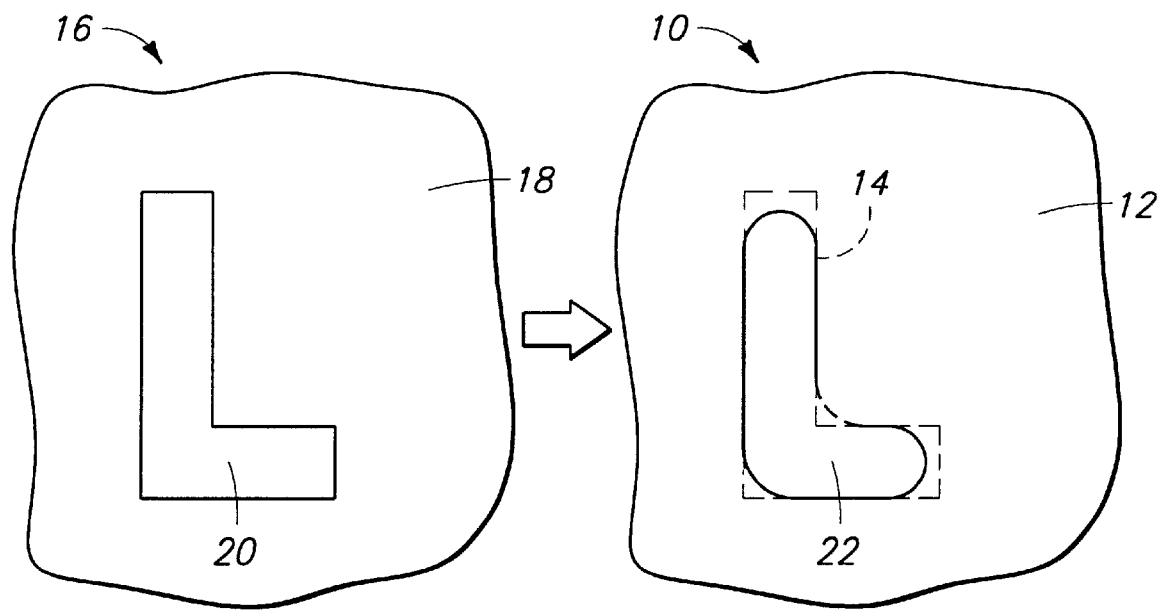
FIG. 2 is a view of a prior art radiation patterning process.
Figure 3:
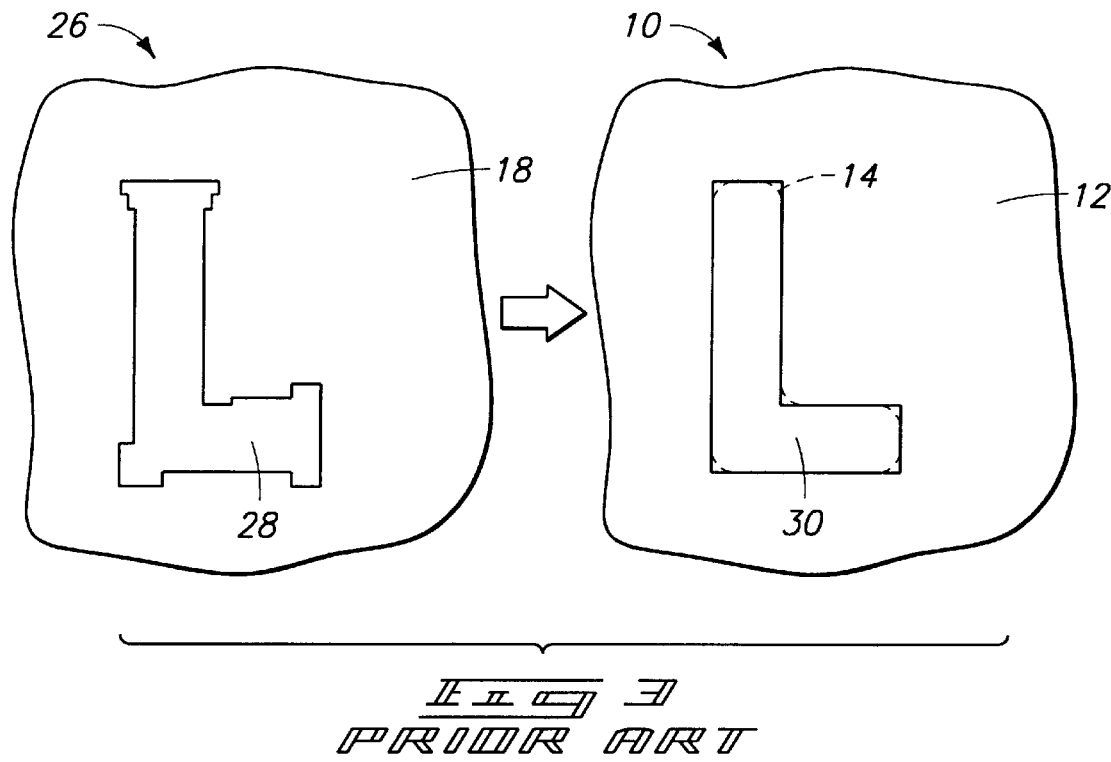
FIG. 3 is a view of another prior art radiation patterning process.
Figure 4:
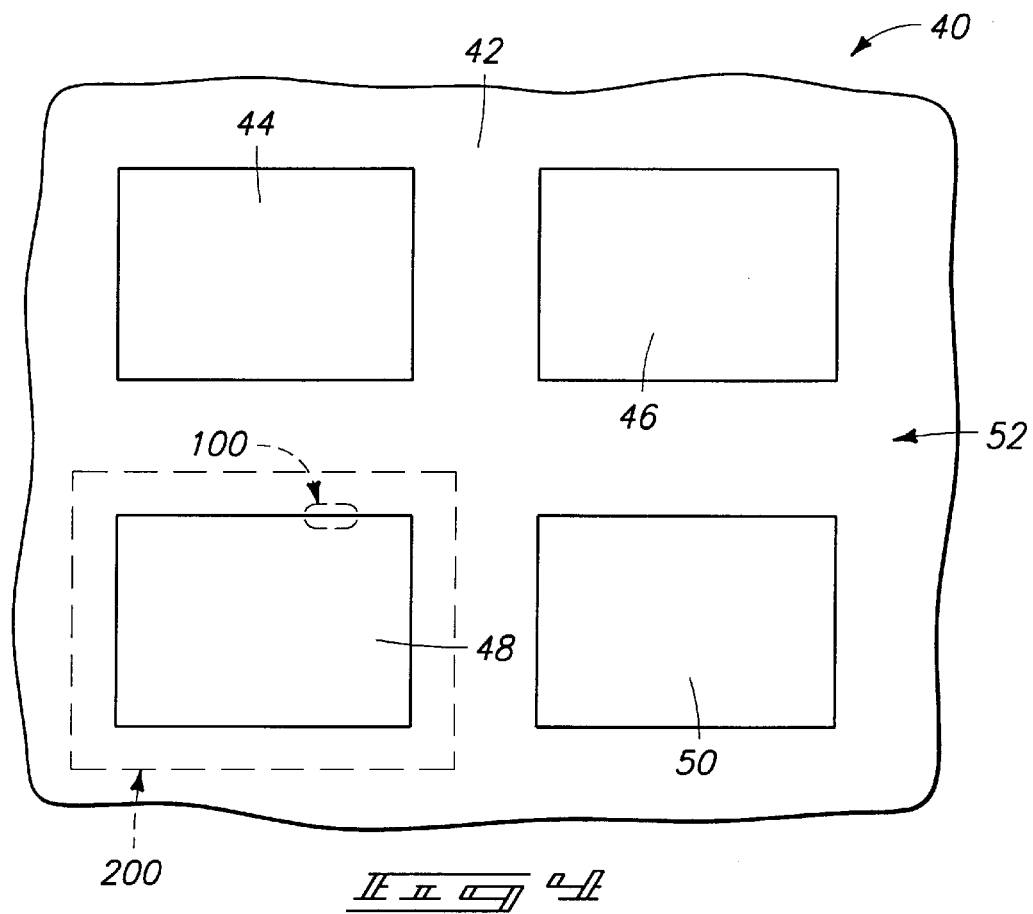
FIG. 4 is a diagrammatic, fragmentary, top view of a semiconductor wafer fragment having DRAM and peripheral circuitry areas defined thereon.

An aspect of the invention is described to FIGS. 4–6. Referring to FIG. 4, a semiconductive wafer fragment 40 is shown. Fragment 40 comprises a substrate 42 having a plurality of DRAM array areas 44, 46, 48 and 50 defined thereon. Additionally, substrate 42 has a peripheral circuitry area 52 defined as an area around and between DRAM array areas 44, 46, 48 and 50.

To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A DRAM array circuit pattern (not shown) extends within DRAM array areas 44, 46, 48 and 50 to form DRAM circuitry within such areas. Also, peripheral circuitry (not shown in FIG. 4) extends within peripheral circuitry area 52, and can include, for example, circuitry for inputting and accessing information stored within the DRAM arrays.

FIG. 5 shows a zoomed-in view of region 100 of the FIG. 4 wafer fragment 40. Region 100 comprises a portion of peripheral circuitry area 52, as well as a portion of DRAM array area 48. Regions 48 and 52 are demarcated by a dashed line 49. A plurality of circuit elements 102, 104, 106, 108, 110, 112 and 114 are shown in the view of FIG. 5. Further, it is shown that at least some of the circuitry present in DRAM array area 48 is proximate to circuitry in peripheral circuitry area 52. In fact, circuit elements 102, 104, 106 and 110 extend across demarcation line 49 and comprise portions in both DRAM array area 48 and peripheral circuitry area 52. It is to be understood that the circuitry shown in FIG. 5 is provided to illustrate an aspect of the present invention, and not to quantitatively reflect actual circuitry utilized in either peripheral or memory array regions of a DRAM circuit.

In accordance with one aspect of the invention, it is recognized that OPC calculations performed relative to circuitry in peripheral circuitry area 52 can generate erroneous results if the calculations ignore circuitry in DRAM area 48. For instance, if the OPC calculations were performed solely for circuitry in peripheral circuitry area 52, such calculations would assume that circuit elements 102, 104, 106 and 110 terminated at line 49, and would accordingly generate features for a radiation-patterning tool which corresponded to terminal ends at line 49 for circuit elements 102, 104, 106 and 110. Such terminal ends could be spaced from line 49, and lead to failure of at least some of the circuit elements, as the ends would not connect with the portions of lines 102, 104, 106 and 110 formed in DRAM area 48. The above-discussed prior art methodologies for performing OPC calculations relative to DRAM circuits (wherein an entirety of a DRAM array is ignored while performing OPC calculations relative to peripheral circuitry) can thus adversely impact the performance of circuitry ultimately formed by radiation-patterning tools designed from the OPC calculations.

FIG. 6 illustrates a region 200 of FIG. 4 wafer fragment 40, and further illustrates methodology of the present invention. FIG. 6 shows DRAM array area 48, and a portion of peripheral circuitry area 52. Further, FIG. 6 shows DRAM array area 48 divided into a first region 70 and a second region 80.

First region 70 is a portion of DRAM array area 48 proximate peripheral circuitry area 52, and a portion which is to be digitally mapped and utilized in a OPC calculations pertaining to peripheral circuitry region 52. In the shown embodiment, region 70 has a shape of a rectangular ring. Such shape can be preferred as rectangles can be easier to digitally map than more complex shapes. However, it is to be understood that region 70 can comprise shapes other than the shown rectangular ring.

The ring of region 70 has a uniform thickness "Y" which extends from an inner periphery of the ring to an outer periphery, and which defines a minimum thickness from the inner periphery to the outer periphery. Although the shown region 70 has a uniform thickness around its inner periphery, it is to be understood that the invention encompasses other embodiments (not shown) wherein region 70 comprises a ring having a non-uniform thickness around its inner periphery. Thickness "Y" is preferably from about 1 micron to about 2 microns. More preferably, thickness "Y" is determined by a wavelength of radiation which is to be patterned with a radiation-patterning tool in forming circuitry within areas 48 and 52. Specifically, thickness "Y" is preferably about twice the wavelength ($\lambda$) of radiation which is to be patterned divided by a numerical aperture (NA) (i.e. $2\lambda/NA$) of a lens utilized to focus the radiation during the patterning.

In particular aspects of the present invention, a pattern can be defined for a radiation-patterning tool substrate is as follows. Initially, DRAM array area circuitry which is to be formed within region 70 is digitally mapped. The digital map can be considered a DRAM dataset which defines a radiation masking pattern for at least some of the DRAM circuitry that is to be formed within DRAM array area 48. Additionally, peripheral circuitry which is to be formed within peripheral circuitry area 52 is digitally mapped to form a peripheral circuitry dataset which defines a radiation masking pattern for forming at least some of the peripheral circuitry within region 52. OPC calculations are then performed on the peripheral circuitry dataset. The OPC calculations utilize at least a portion of the DRAM dataset corresponding to region 70. The OPC calculations modify the peripheral circuitry dataset, but do not modify the DRAM dataset. It is preferred to utilize only the relatively small region 70 of memory array area 48, rather than an entirety of. memory array area 48, as it is typically only small region 70 which will significantly impact OPC calculations pertaining to peripheral circuitry area 52. Accordingly, a substantial amount of calculation time can be saved by utilizing only the small region 70, rather than an entirety of memory array area 48, without sacrificing any significant quality of a radiation-patterning tool that is ultimately formed. Region 70 typically corresponds to less than or equal to 10% of DRAM array area 48, and more typically corresponds to less than or equal to 5% of DRAM array area 48. Accordingly, 90–95% of DRAM array area 48 is typically ignored when performing OPC calculations on peripheral circuitry area 52 in accordance with methods of the present invention.

After the peripheral circuitry dataset is modified by the OPC calculations, such dataset is utilized to form a pattern on a portion of a radiation-patterning tool. Another portion of the pattern on the radiation-patterning tool is formed to correspond to a DRAM array area, and can be formed utilizing prior art techniques. An exemplary prior art technique comprises manual stepping of an OPC corrected repeating unit corresponding to a repeating unit of a DRAM array circuit. Such manual stepping forms a dataset corresponding to a DRAM array patterning portion of a radiation-patterning tool. The DRAM array patterning portion can then be formed within the radiation-patterning tool.

Although only a portion of wafer fragment 40 is described with reference to FIG. 6, it is to be understood that an entirety of the peripheral circuitry 52 of the FIG. 4 fragment 40 can be subjected to common OPC calculations. If an entirety of peripheral circuitry 52 of FIG. 4 is subjected to common OPC calculations, then each of DRAM array areas 44, 46, 48 and 50 can be divided into distinct regions corresponding to the regions 70 and 80 of FIG. 6. Accordingly, each of DRAM array areas 44, 46, 48 and 50 will comprise a central region (corresponding region 80 of FIG. 6) which is excluded from OPC calculations, and an outer peripheral region (corresponding to region 76) which is incorporated into OPC calculations pertaining to peripheral region 52, but not modified by such calculations. The portions excluded from the calculations can, in preferred embodiments, have rectangular shapes (such as the rectangular shape shown for region 80 of FIG. 6), and can accordingly correspond to a plurality of separated rectangular regions of DRAM array areas.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An optical proximity correction method, comprising:

providing a radiation-patterning tool substrate;

digitizing a first radiation masking pattern for a first part of a radiation-patterning tool formed from the substrate;

digitizing a second radiation masking pattern for a second part of the radiation-patterning tool formed from the substrate;

performing OPC calculations on the digitized second radiation masking pattern and altering the digitized second radiation masking pattern based on the calculations, the OPC calculations of the digitized second radiation masking pattern utilizing at least a portion of the digitized first radiation masking pattern without altering said portion of the digitized first radiation masking pattern; and creating a pattern in the radiation-patterning tool substrate utilizing the altered digitized second radiation masking pattern.

2. The method of claim 1 wherein only a portion of the first radiation masking pattern is utilized to alter the OPC calculations of the second radiation masking pattern.

3. The method of claim 1 wherein:

the radiation masking pattern of the first part of the radiation-patterning tool defines first circuitry for an integrated circuit;

the radiation masking pattern of the second part of the radiation-patterning tool defines second circuitry for the integrated circuit; and the first circuitry contacts the second circuitry in the integrated circuit.

4. The method of claim 3 wherein only a portion of the first radiation masking pattern is utilized to alter the OPC calculations of the second radiation masking pattern, and another portion of the first radiation masking pattern is excluded from being utilized to alter the OPC calculations; and wherein the excluded portion of the first radiation masking pattern corresponds to a rectangular region of the first circuitry.

5. The method of claim 4 wherein the utilized portion of the first radiation masking pattern corresponds to a rectangular ring around said rectangular region.

6. The method of claim 4 wherein the utilized portion of the first radiation masking pattern corresponds to a rectangular ring around said rectangular region, and comprises less than or equal 10% of the combined area of the rectangular ring and rectangular region.

7. The method of claim 4 wherein the utilized portion of the first radiation masking pattern corresponds to a rectangular ring around said rectangular region, and comprises less than or equal 5% of the combined area of the rectangular ring and rectangular region.

8. A method of forming a radiation-patterning tool, comprising:

defining at least one DRAM array area of a semiconductive material substrate and at least one peripheral circuitry area proximate the at least one DRAM array area;

digitizing at least some circuitry within the DRAM array area to define a digitized DRAM pattern;

digitizing at least some circuitry within the peripheral circuitry area to define a digitized peripheral circuitry pattern;

performing OPC calculations on the digitized peripheral circuitry pattern and altering the digitized peripheral circuitry pattern based on the calculations, the OPC calculations of the digitized peripheral circuitry pattern utilizing at least a portion of the digitized DRAM pattern without altering the digitized DRAM pattern by the OPC calculations; and utilizing the altered digitized peripheral circuitry pattern and digitized DRAM pattern to form a pattern supported by a radiation-patterning tool substrate.

9. The method of claim 8 wherein only a portion of the digitized DRAM pattern is utilized in the OPC calculations and an other portion of the digitized DRAM pattern is not utilized.

10. The method of claim 9 wherein said other portion of the digitized DRAM pattern corresponds to a rectangular region of the DRAM array area.

11. The method of claim 10 wherein the utilized portion of the digitized DRAM pattern corresponds to a rectangular ring around said rectangular region, and comprises less than or equal 10% of the combined area of the rectangular ring and rectangular region.

12. The method of claim 11 wherein the rectangular ring has an inner periphery and an outer periphery, and a minimum thickness from the inner periphery to the outer periphery of from about 1 micron to about 2 microns.

13. The method of claim 11 wherein the utilized portion of the digitized DRAM pattern corresponds to a rectangular ring around said rectangular region, and comprises less than or equal 5% of the combined area of the rectangular ring and rectangular region.

14. The method of claim 9 wherein the DRAM array comprises a plurality of regions separated by the peripheral circuitry area, and wherein said other portion of the digitized DRAM pattern corresponds to a plurality of separated rectangular regions of the DRAM array area.

* * * * *

UNITED STATES PATENT AND TRADEMARK OFFICE
CERTIFICATE OF CORRECTION

PATENT NO. : 6,447,961 B2
DATED : September 10, 2002
INVENTOR(S) : John R C Futrell et al.

It is certified that error appears in the above-identified patent and that said Letters Patent is hereby corrected as shown below:

Title page,
Item [54], replace second line of title with -- METHODS, AND METHODS OF FORMING --

Column 6,
Line 27, replace "entirety of. memory array area 48, as it is" with -- entirety of memory array area 48, as it is --

Column 8,
Line 48, replace "The method of claim 11 wherein" with -- The method of claim 10 wherein --

Signed and Sealed this

Thirteenth Day of May, 2003

JAMES E. ROGAN
*Director of the United States Patent and Trademark Office*